(12) United States Patent
Furuyama

(10) Patent No.: US 7,773,657 B2
(45) Date of Patent: Aug. 10, 2010

(54) LASER-INDUCED OPTICAL WIRING APPARATUS

(75) Inventor: Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 12/188,840

(22) Filed: Aug. 8, 2008

(65) Prior Publication Data

US 2009/0080480 A1    Mar. 26, 2009

Related U.S. Application Data

(62) Division of application No. 11/531,936, filed on Sep. 14, 2006, now Pat. No. 7,421,002.

(30) Foreign Application Priority Data

Nov. 8, 2005    (JP) .............................. 2005-323666

(51) Int. Cl.
*H01S 3/03* (2006.01)
(52) U.S. Cl. ..................... 372/64; 372/50.11; 372/99
(58) Field of Classification Search .................. 372/64, 372/50.11, 99
See application file for complete search history.

(56) References Cited

U.S. PATENT DOCUMENTS 7,065,108 B2    6/2006    Park et al.

2005/0013337 A1 *    1/2005    Jung et al. ..................... 372/50
2006/0050752 A1 *    3/2006    Nunoya et al. ........... 372/43.01
2008/0165809 A1    7/2008    Furuyama

FOREIGN PATENT DOCUMENTS

JP    63318529 A    12/1988
JP    6-132516    5/1994

OTHER PUBLICATIONS

B.S. Kawasaki, et al., "Full duplex transmission link over single-strand optical fiber," Optics Letters, vol. 1, No. 3, Sep. 1977, pp. 107 and 108.
T. Ozeki, et al., "Half-duplex optical transmission link using an LED source-detector scheme," Optics Letters, vol. 2, No. 4, Apr. 1978, pp. 103-105.

* cited by examiner

Primary Examiner—Dung T Nguyen
(74) Attorney, Agent, or Firm—Oblon, Spivak, McClelland, Maier & Neustadt, L.L.P.

(57) ABSTRACT

A laser-induced optical wiring apparatus includes a substrate, first and second light-reflecting members provided on the substrate separately from each other, an optical waveguide provided on the substrate for optically coupling the first and second light-reflecting members to form an optical resonator, a first optical gain member provided across the optical waveguide and forming a laser oscillator along with the first and second light-reflecting members, and a second optical gain member provided across the optical waveguide separately from the first optical gain member, and forming another laser oscillator along with the first and second light-reflecting members.

5 Claims, 7 Drawing Sheets

LASER-INDUCED OPTICAL WIRING APPARATUS

CROSS-REFERENCE TO RELATED APPLICATIONS

This application is a Divisional application of Ser. No. 11/531,936 filed Sep. 14, 2006, which is based upon and claims the benefit of priority from prior Japanese Patent Application No. 2005-323666, field Nov. 8, 2005, the entire contents of which are incorporated herein by reference.

BACKGROUND OF THE INVENTION

1. Field of the Invention

The present invention relates to a laser-induced optical wiring apparatus in which optical wiring is realized by a laser oscillator.

2. Description of the Related Art

Drastic enhancement of the operation speed of LSIs has been achieved by the enhancement of performance of electronic devices, such as bipolar transistors and field effect transistors. However, while the performance of electronic devices is enhanced by the microfabrication of transistors, the wiring resistance or inter-wiring capacitance in the devices is increased as a result of the microfabrication. The increases in the wiring resistance or inter-wiring capacitance are becoming a bottleneck in the increase of the performance of LSIs.

In consideration of such a problem in electric wiring as the above, several optical wiring LSIS, in which light is used to connect elements in the LSIs, have been proposed (see, for example, JP-A H6-132516 (KOKAI). Optical wiring is almost free from the dependency of loss upon frequency regardless of whether the current supplied thereto is a direct current or an alternating current of 100 GHz or more, and from disorder in wiring paths due to electromagnetism.

However, such a conventional technique as that of JP-A H6-132516 (KOKAI) exhibits significantly low reproducibility and reliability if it is applied to LSIs with an extremely large number of wires. For instance, even if it is assumed that optical wiring is employed only for the uppermost layer (global layer) of LSI wiring, one LSI chip may well include several hundreds of optical wires. In this case, to operate one LSI, it is necessary to operate several hundreds of optical wires with all the wires kept in good condition. In light of the manufacturing yield of LSIs, this means that reproducibility and reliability are required for the production technique, which enable no single defective optical wire to be contained in several tens of thousands to several hundreds of thousands of optical wires produced. Thus, each optical wire for LSIs must have extremely high reproducibility and reliability. To this end, each optical wire must have an extremely simple structure and an extremely small size for highly integration.

Basically, a light-emitting element, optical waveguide and light-receiving element are essential elements for the conventional optical wiring. Accordingly, light-emitting element techniques, light-receiving element techniques and optical waveguide techniques are necessary. It is also necessary to make a complete survey of various techniques including peripheral techniques, such as optical coupling techniques for efficiently optically coupling the light-emitting element to the light-receiving element, and optical transmission system designing techniques. Moreover, those basic elements differ from each other in operation principle, material, structure, processing technique, and hence it is necessary to delicately combine materials and processing techniques to form optical wiring. This process is extremely difficult to realize.

As described above, in conventional optical wiring techniques, since the structural elements are very complex, and various materials must be used to form the elements, problems will easily occur in the stability or reproducibility of the characteristics. Furthermore, it is difficult to reduce the size of the wiring. Thus, the conventional optical wiring techniques include a large number of unsuitable factors for LSI wiring.

BRIEF SUMMARY OF THE INVENTION

In accordance with a first aspect of the invention, there is provided a laser-induced optical wiring apparatus comprising:

a substrate;

a first light-reflecting member and a second light-reflecting member, which are provided on the substrate separately from each other;

an optical waveguide provided on the substrate, the optical waveguide optically coupling the first light-reflecting member and the second light-reflecting member to form an optical resonator;

an optical gain member provided across a portion of the optical waveguide and forming a laser oscillator along with the first light-reflecting member and the second light-reflecting member; and an optical switch provided across a portion of the optical waveguide separately from the optical gain member, the optical switch performing a switching operation to change a loss of an optical path extending between the first light-reflecting member and the second light-reflecting member in accordance with an input signal to change a laser oscillation state of the laser oscillator.

In accordance with a second aspect of the invention, there is provided a laser-induced optical wiring apparatus comprising:

a substrate;

a first light-reflecting member and a second light-reflecting member, which are provided on the substrate separately from each other;

an optical waveguide provided on the substrate, the optical waveguide optically coupling the first light-reflecting member and the second light-reflecting member to form an optical resonator;

a first optical gain member provided across a portion of the optical waveguide and forming a first laser oscillator along with the first light-reflecting member and the second light-reflecting member; and a second optical gain member provided across a portion of the optical waveguide separately from the first optical gain member, and forming a second laser oscillator along with the first light-reflecting member and the second light-reflecting member.

In accordance with a third aspect of the invention, there is a laser-induced optical wiring apparatus comprising:

a substrate;

a first light-reflecting member and a second light-reflecting member, which are provided on the substrate separately from each other;

a third light-reflecting member and a fourth light-reflecting member, which are provided on the substrate separately from each other;

a first optical waveguide provided on the substrate, the first optical waveguide optically coupling the first light-reflecting member and the second light-reflecting member to form a first optical resonator;

a first optical gain member provided across the first optical waveguide and forming a first laser oscillator along with the first light-reflecting member and the second light-reflecting member;

a second optical gain member provided across the first optical waveguide separately from the first optical gain member, and forming a second laser oscillator along with the first light-reflecting member and the second light-reflecting member;

a second optical waveguide provided on the substrate perpendicularly to the first optical waveguide, the second optical waveguide optically coupling the third light-reflecting member and the fourth light-reflecting member to form an optical resonator;

a third optical gain member provided across the second optical waveguide and forming a laser oscillator along with the third light-reflecting member and the fourth light-reflecting member; and a fourth optical gain member provided across the second optical waveguide separately from the third optical gain member, and forming a laser oscillator along with the first light-reflecting member and the second light-reflecting member.

DETAILED DESCRIPTION OF THE INVENTION

The gist of the present invention does not lie in one-way light transmission operation, but lies in that a light emitting element, optical waveguide and another light emitting element are spatially distributed and made to cooperate to serve as a single system including two single laser oscillators, and each laser operation of the system is transmitted as a signal. Namely, utilizing the fact that when there is an operation slower than the standard operation speed of the system, this operation is instantly transmitted to the whole system, transmission of a signal to a spatially separate place is realized. At this time, one of the light emitting elements is made to function as an optical switch for controlling the optical gain (or loss) of the system including the two laser oscillators, and the other element is made to function as a receiver for receiving and transmitting, to the outside, variations in, for example, excited carriers corresponding to variations in the optical amount of the whole system.

A detailed description will be given of the present invention, using the embodiments shown in the accompanying drawings. In the embodiments, several specific materials are employed. However, the invention is not limited to them. It is sufficient if the material can perform laser oscillation. Accordingly, the invention is not limited to the embodiments described below. Further, in the embodiments, one or two optical wires are described. Actually, however, a large number of optical wires are integrated on an LSI chip. Any arbitrary number of optical wires may be employed.

First Embodiment

Figure 1:
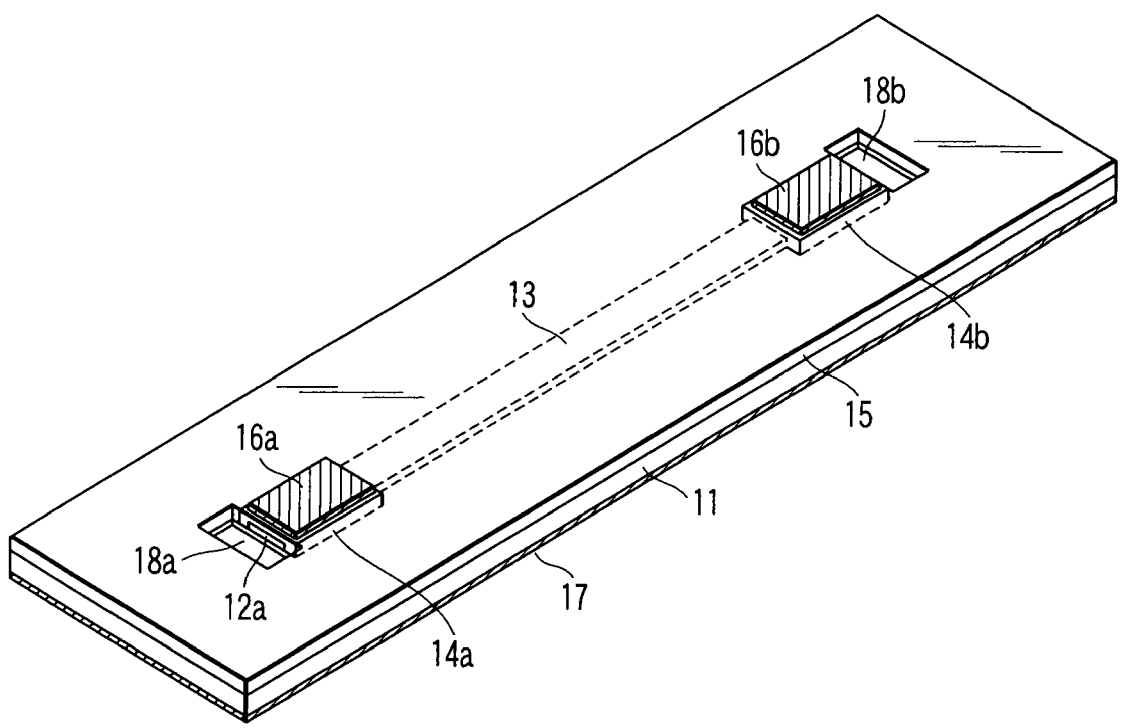
FIG. 1 is a schematic perspective view illustrating the structure of a laser-induced optical wiring apparatus according to a first embodiment.
Figure 2:
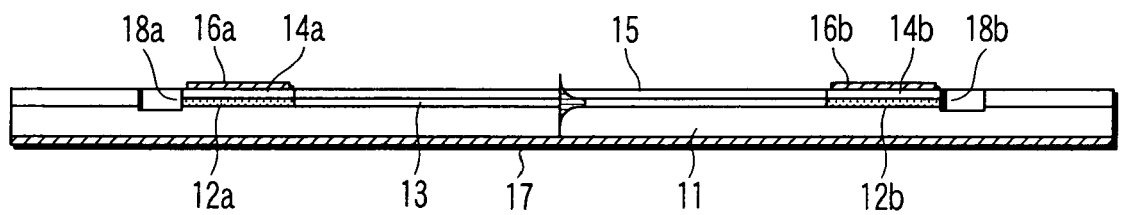
FIG. 2 is a schematic sectional view illustrating the structure of the laser-induced optical wiring apparatus of the first embodiment.

FIG. 1 is a schematic perspective view illustrating the structure of a laser-induced optical wiring apparatus according to a first embodiment. FIG. 1 shows only elements necessary for optical wiring. Further, FIG. 2 shows the cross section taken along the axis of the apparatus of FIG. 1. Although the first embodiment employs GaInAsP/InP-based materials as material examples of the apparatus, it may employ other materials, such as GaAlAs/GaAs-based materials, Si and SiGe/Si.

In FIGS. 1 and 2, reference number 11 denotes an n-type InP substrate, reference numbers 12a and 12b denote GaInAsP active layers (laser medium having an emission wavelength of 1.3 μm), reference number 13 denotes a GaInAsP optical waveguide core (having, for example, a band gap wavelength of 1.2 μm), reference numbers 14a and 14b denote p-type InP layers, and reference number 15 denotes a semi-insulated clad layer (e.g., an Fe-doped InP layer). Further, reference numbers 16a and 16b denote p-side electrodes (formed of, for example, AuZn), reference number 17 denotes an n-side electrode (formed of, for example, AuGe), and reference numbers 18a and 18b denote mirrors formed by dry etching.

On the InP substrate 11, the GaInAsP optical waveguide core 13 formed to stripe, and semi-insulated clad layer 15 covers the stripe and the periphery. The mirrors 18a and 18b are formed by dry-etching the opposite ends of the stripe structure. The GaInAsP active layers 12a and 12b are provided near the opposite ends of the optical waveguide core 13, and the p-type InP layers 14a and 14b are provided near the opposite ends of the semi-insulated clad layer 15.

The p-side electrodes 16a and 16b are provided on the InP layers 14a and 14b, respectively, and the n-side electrode 17 is provided on the lower surface of the substrate 11. Namely, an optical waveguide (optical waveguide core 13) is formed, connecting the mirrors 18a and 18b to each other. A first optical gain section (active layer 12a) and a second optical gain section (active layer 12b) that forms a laser oscillator along with the mirrors 18a and 18b and optical waveguide core 13. Assume here that each active layer 12 has, for example, a thickness of 0.12 μm, a width of 1 μm, and a length of 50 μm. Further, assume that the optical waveguide core 13 has, for example, a thickness of 0.12 μm, a width of 1 μm, and a length of 1 mm. The active layers 12 and optical waveguide core 13 may have a quantum well structure. The length of the optical waveguide core 13 serves as a parameter for determining the maximum operation frequency of the laser oscillator, if it is longer than a certain value, the operation speed of the optical wiring apparatus is limited. This will be explained later.

As shown in FIG. 2, the active layers 12a and 12b are directly connected to the optical waveguide core 13, and the layers 12a and 12b are optically coupled to each other. The active layers 12a and 12b and optical waveguide core 13 may be sequentially formed by crystal growth and patterning. Alternatively, firstly, crystal growth may be made using a composition control technique using selective growth, such as a multi-quantum-well structure, and then the resultant structure be patterned into the layers 12a and 12b and core 13. Further, the mirrors 18a and 18b having perpendicular end faces are provided at the outer ends of the active layers 12a and 12b, thereby forming a so-called fabry-Perot oscillator. In the first embodiment, basically, it is not necessary to output light to the outside of the apparatus. Therefore, the mirror reflectance may be enhanced by providing the perpendicular end faces with high reflection coating or metal coating (not shown).

Further, instead of dry-etching the outer ends of the active layers 12a and 12b, an extended optical waveguide with a diffraction grating may be provided to form a distributed Bragg reflector (DBR) laser structure. Alternatively, a diffraction grating may be provided near the upper, lower, left or right portion of each active layer 12a, 12b to form a distributed feedback (DFB) laser structure. When the DFB laser structure is employed, even only one of the active layers 12a and 12b can oscillate in principle. However, to realize a cooperative operation of the active layers 12a and 12b, the oscillation threshold value for each active layer is set relatively high. The operation principle of the laser-induced optical wiring apparatus constructed as the above will be now be described.

Figure 3:
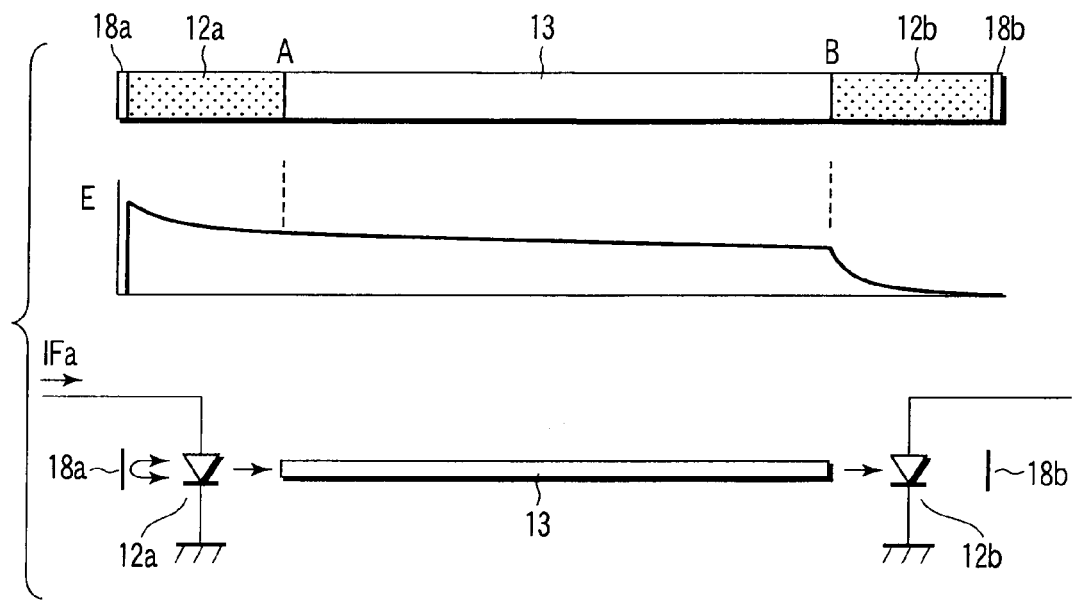
FIG. 3 is a view useful in explaining the operation of the first embodiment.
Figure 4:
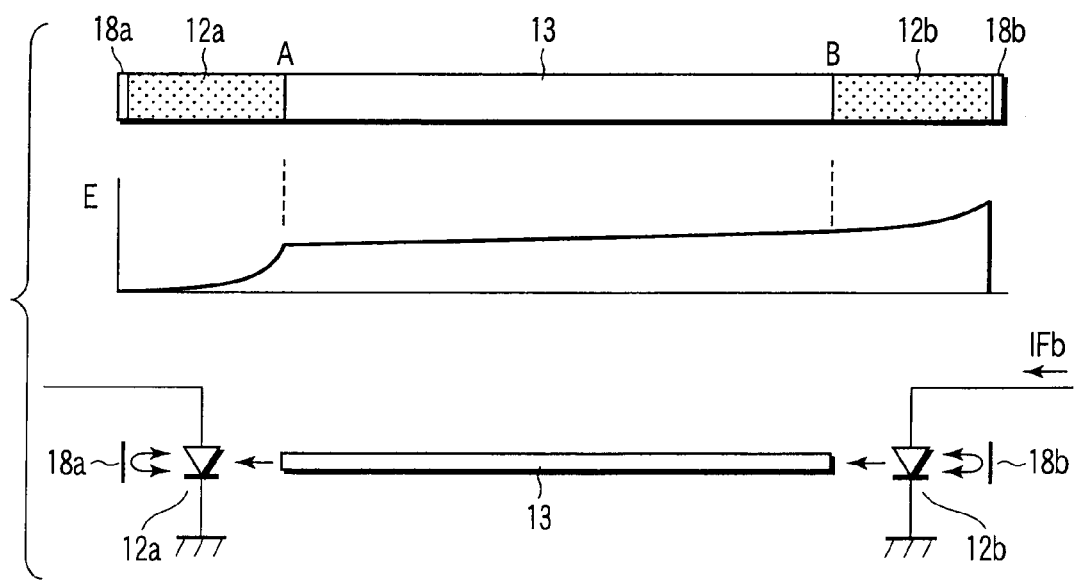
FIG. 4 is another view useful in explaining the operation of the first embodiment.

FIGS. 3 and 4 are views useful in explaining the operation of the laser-induced optical wiring apparatus. In each of FIGS. 3 and 4, the upper portion is a schematic sectional view mainly showing the active section of the laser-induced optical wiring apparatus, the middle portion shows an internal light intensity distribution, and the lower portion shows an equivalent circuit. Reference numbers 12a and 12b denote the laser active layers, reference number denotes the optical waveguide core, and reference numbers 18a and 18b denote the reflection mirrors.

When only the active layer 12a is activated (i.e., a current is flown into only the layer 12a), the internal light intensity (E) exhibits a gentle attenuation distribution curve between the active layer 12a and the optical waveguide 13, as is shown in FIG. 3. However, abrupt light absorption occurs, i.e., abrupt light attenuation occurs, in the active layer 12b that has the same band-gap as the active layer 12a. To make the system in this state perform laser oscillation, it is necessary to strongly activate the active layer 12a until the active layer 12a is made transparent by optical activation. This process, however, is very hard to execute. In contrast, when only the active layer 12b is activated as shown in FIG. 4, a light distribution opposite to that of FIG. 3 is acquired. Of course, it is also difficult to perform laser oscillation in this state.

Figure 5:
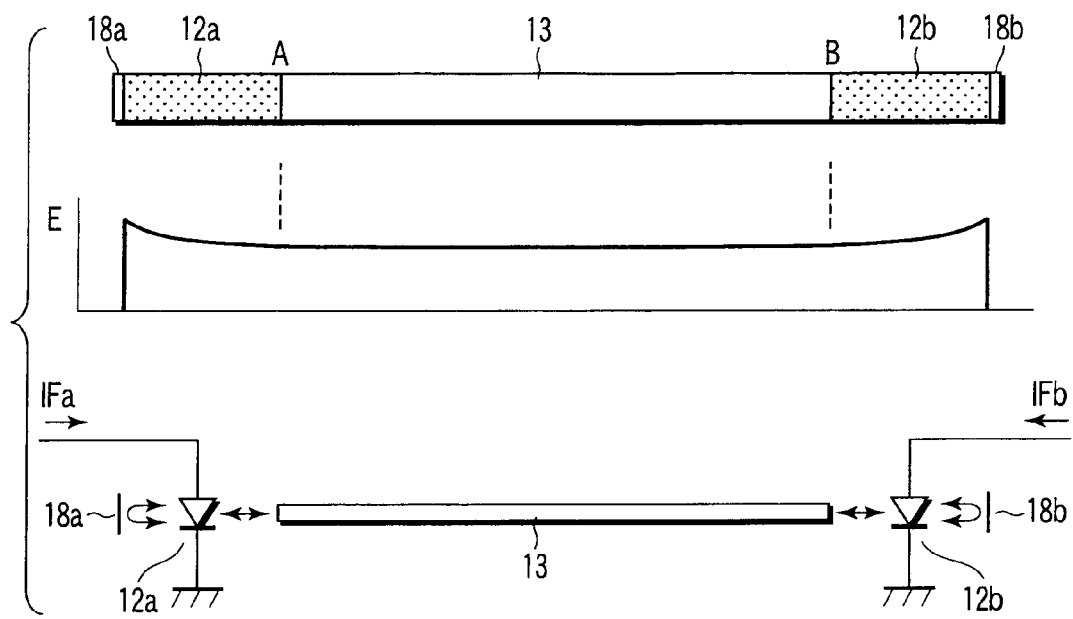
FIG. 5 is yet another view useful in explaining the operation of the first embodiment.

When both the active layers 12a and 12b are activated as shown in FIG. 5, a substantially uniform internal light distribution is acquired, i.e., the gain of light acquired when light makes a circuit of the system can be set to 1. Namely, laser oscillation is possible. Assume here that the reflectance of the mirror 18a (located closer to the active layer 12a), the reflectance of the mirror 18b (located closer to the active layer 12b), the length of the active layer 12a, the length of the active layer 12b, the induction emission gain of the active layer 12a, the induction emission gain of the active layer 12b, the absorption loss of the active layer 12a, the absorption loss of the active layer 12b, the length of the optical waveguide 13, the absorption loss of the optical waveguide 13, the coupling coefficient between the active layer 12a and optical waveguide 13, and the coupling coefficient between the active layer 12b and optical waveguide 13 are used as characteristic parameters Ra, Rb, La, Lb, ga, gb, αa, αb, Lt, αt, Ca and Cb, respectively. In this case, the laser oscillation condition for the entire system is that under which light can maintain its original intensity even after making a circuit of the system. Namely, the following equation must be satisfied:

$$\ln\{1/(Ra \times Rb \times Ca \times Ca \times Cb \times Cb)\} = 2(ga \times La + gb \times Lb - \alpha a \times La - \alpha b \times Lb - \alpha t \times Lt) \quad (1)$$

where ga and gb are functions concerning carriers (current) injected into the active layers 12a and 12b, and the other parameters are fixed if the structure is fixed. Accordingly, the laser oscillation condition is that the optical gain based on ga and gb exceeds the optical loss of the system. It is sufficient if the following relationship is established:

$$ga(Ifa)La + gb(IFb)Kb = \alpha a \times La + \alpha b \times Lb + \alpha t \times Lt + [\ln\{1/(Ra \times Rb \times Ca \times Ca \times Cb \times Cb)\}]/2 \quad (2)$$

where IFa and IFb represent activation currents for the active layers 12a and 12b, respectively.

Figure 6:
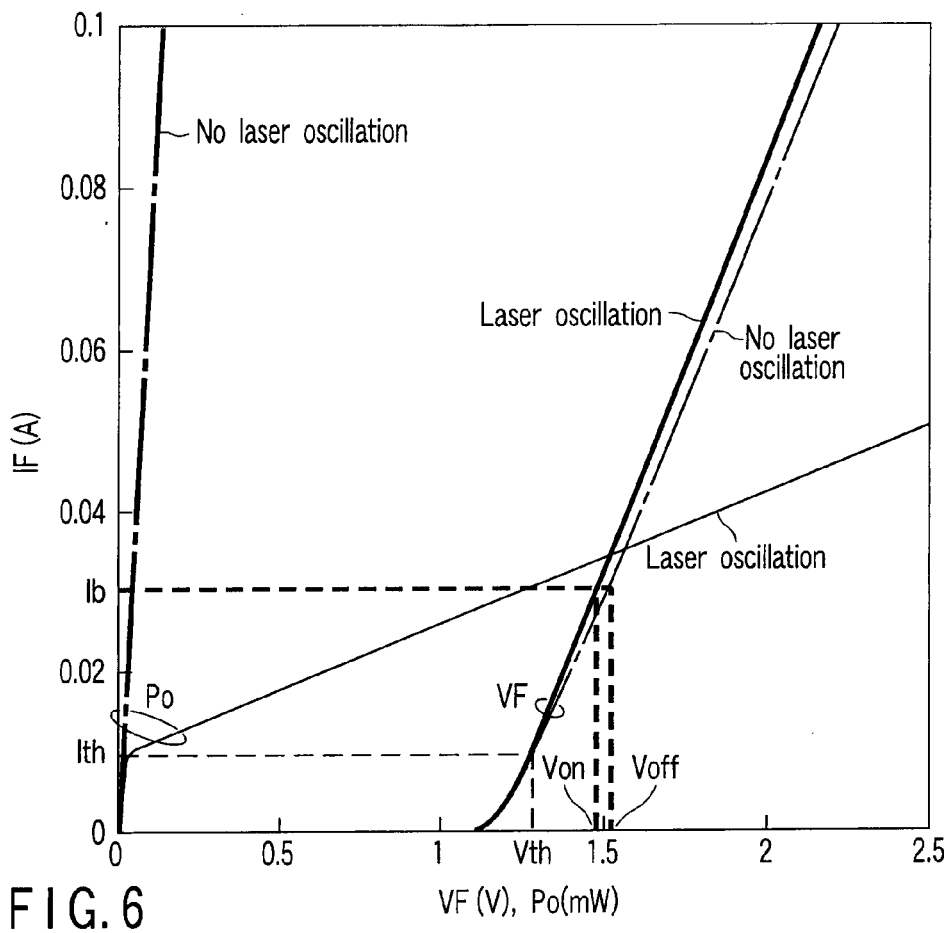
FIG. 6 is a graph illustrating laser oscillation characteristic examples of the laser-induced optical wiring apparatus of the first embodiment.

FIG. 6 shows laser oscillation characteristic examples assumed when an $SiO_2$/Si multi-layer is coated on the perpendicular-end-face mirrors 18a and 18b in the structure of FIG. 1. In the examples, Ra=Rb=80%. Further, IFa=IFb=IF/2, i.e., the same current is flown through the layers 12a and 12b.

In FIG. 6, the abscissa indicates the element voltage (VF) and the optical output (Po) from each mirror end face, while the coordinate indicates the sum (IF=IFa+IFb) of the currents flown through the active layers 12a and 12b. In FIG. 6, two lines of Po indicate the case where the system of FIG. 1 performs laser oscillation, and the case where the system does not perform laser oscillation. Similarly, the two lines of VF indicate those cases. The characteristics corresponding to no laser oscillation are acquired by interrupting optical coupling of the active layers 12a and 12b by non-perpendicular etching of the middle of the optical waveguide 13. In any case, the electrical characteristics of the active layers 12a and 12b do not change.

In FIG. 6, the point at which Po abruptly increases indicates the threshold values for laser oscillation. Specifically, the threshold values are the current threshold value Ith, and the voltage threshold value Vth. FIG. 6 shows the characteristics acquired when symmetrical activation of IFa=IFb is performed. If IFa≠IFb, the resultant current and voltage threshold values may well be deviated from Ith and Vth in FIG. 6 because of the nonlinear characteristic of gain g (IF).

The active layers 12a and 12b serve as diodes held between the p-type clad layers 14a and 14b and the n-type clad layer (substrate) 11, respectively, and their current/voltage characteristic is given by $$I = I0[\exp\{(V - I \times Rs)e/n \times k \times T\}] \quad (3)$$

where Rs is the internal resistance of a pn-junction diode formed of the elements 16a (or 16b), 14a (or 14b), 12a (or 12b), 11 and 17, I0 is a saturation current, n is a constant for the diode, k is the Boltzmann constant, and T is the absolute temperature. The following equation can be extracted from equation (3):

$$V1 = \{\ln(I1/I0)\} n \times k \times T/e + I1 \times Rs (I1 < Ith) \quad (4)$$

In general, when a semiconductor layer performs laser oscillation, the active layer voltage (junction potential) is fixed at the threshold voltage, therefore the element voltage is given by $$V2 = \{\ln(Ith/I0)\} n \times k \times T/e + I2 \times Rs (I2 > Ith) \quad (5)$$

In this case, the first term serves as a constant for the current. Assume here that optical coupling is controlled by the same elements, and the state is switched between the laser oscillation state and non-oscillation state, as shown in FIG. 6. Further, I1=L2=Lb is replaced with the above-mentioned V1 and V2, and the difference between V1 and V2 is set to ΔV, thereby acquiring the following equation:

$$\Delta V = \{\ln(Ib/Ith)\} n \times k \times T/e \quad (6)$$

ΔV is equal to the difference (Voff−Von) between Voff and Von. In a semiconductor laser element, if the state can be switched between the laser oscillation state and non-oscillation state, with the current flown therethrough kept constant, this means that the voltage of the element varies. In contrast, if the element bias voltage is kept constant, the current flowing through the element varies.

This phenomenon serves as the principle of the laser-induced optical wiring apparatus of the embodiment. Namely, two active layers each having one side functioning as a reflection mirror are optically coupled into a laser oscillator, whereby the laser oscillation state of the entire system is varied by a variation caused in one of the active layers, which results in a variation in the other active layer. In other words, when the two active layers are located separately, a variation caused in one of the active layers is transmitted to the other active layer, with the result that some sort of variation can be extracted from the other active layer. Thus, the laser oscillator can have a signal transmission function.

A description will be given of an operation method example for use in the embodiment of FIG. 1. Firstly, Ib/2 is supplied as a bias current to the electrodes 16a and 16b to thereby set the system in the laser oscillation state (as indicated by the laser oscillation lines of FIG. 6). Subsequently, a signal is supplied to one of the electrodes 16a and 16b. For instance, −Ib/2 as a signal is supplied to the electrode 16a, thereby offsetting the bias current supplied to the electrode 16a. At this time, the laser oscillation of the system is stopped, and the voltage at the electrode 16b increases from Von to Voff. Assuming that Ith=10 mA and Ib=30 mA, the threshold current and bias current of the active layers 12a and 12b are 5 mA and 15 mA, respectively. Further, assuming that the diode constant (n) is 2, ΔV (Voff−Von) is about 57 mV.

The above-described signal supply may also be made to the electrode 16b. In this case, a signal voltage occurs at the electrode 16a. Namely, in the above bias- and signal-supply process, a signal voltage of about 50 mV occurs at the electrode other than that to which a signal is supplied. The active layer of the electrode, to which a signal is supplied, is switched from the gain-on state to the gain-off state and functions as an optical switch. Thus, in the embodiment of FIG. 1, one of the electrodes functions as an optical switch, and the other electrode functions as an optical-gain/signal-receiving section. These functions can be switched from each other, namely, bidirectional transmission can be achieved.

The limit set to the phenomenon that a variation in one active layer appears as a variation in the other active layer will be described. Lasers utilize stimulated emission phenomenon, and it is an essential requirement to apply light to an activated laser medium. Accordingly, when two active layers are located separately and a laser oscillator is formed therebetween as in the first embodiment, stimulated emission occurs, delayed by the time corresponding to the optical transmission time between the active layers (or between the mirrors). This means that the time corresponding to the delay time is required for starting the laser oscillation operation. Therefore, in the laser-induced optical wiring apparatus of the embodiment, it is difficult for the laser oscillator to operate in a shorter time than the time required for light goes round the laser cavity.

However, in the example of FIG. 1, assuming that the effective reflectance of the active layers and optical waveguide is 3.5, and the laser oscillator length is about 1 mm, the time required for light to make a circuit of the system is about 23 ps, and the maximum response speed is about 40 GHz. Namely, signals of about ten and several GHz can be sufficiently processed. In the case of non-return-to-zero (NRZ) signals for general logic data, signals of about 20 Gbps can be processed.

As described above, in the first embodiment, the optical waveguide 13 that optically couples the first and second mirrors 18a and 18b is provided on the substrate 11, and the first and second active layers 12a and 12b, which cooperate to form a laser oscillator, are provided near the mirrors 18a and 18b, respectively, whereby the emission elements and optical waveguide serve as base elements for optical wiring. Since no dedicated light receiving elements are necessary, and the system is designed only for the laser operation. Strict designing for optical transmission, such as setting of optical transmission/receiving levels based on the minimum receiving sensitivity or optical coupling efficiency, is not required.

Optical transmission is essentially transmission of waveforms even if the data is digital one. Thus, it is regarded as transmission of analog data. Therefore, it should be elaborately designed in order to prevent noise from mingling into the data. The optical wiring used in this embodiment, the signals represent whether the laser emits light or not in the system. Hence, the transmission is essentially digital-data transmission. Errors, if any in the signals, can therefore be much reduced.

Accordingly, the required structural elements for optical wiring are significantly simplified to thereby reduce the factors of variation or failure. Further, the operational margin of the system is significantly enhanced to thereby remarkably reduce the frequency of occurrence of defects in characteristics. Namely, the characteristic reproducibility or reliability of optical wiring can be drastically enhanced, and the practical utility of LSI on-chip optical wiring can be greatly enhanced, which significantly contributes to high integration of, for example, information communication devices.

Further, in the first embodiment, the active layers 12a and 12b are provided near the mirrors 18a and 18b, respectively, and each of the active layers 12a and 12b serves as an optical gain unit for providing a laser oscillator, and also as a signal receiving unit for detecting emission states. As a result, bidirectional signal transmission is possible.

Second Embodiment

Figure 7:
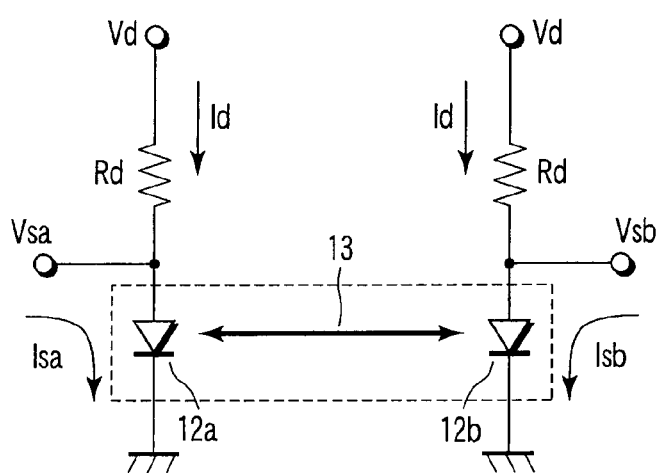
FIG. 7 is a circuit diagram illustrating a laser-induced optical wiring apparatus according to a second embodiment, which includes a circuit equivalent to the apparatus of FIG. 1, and a peripheral circuit.

FIG. 7 shows a laser-induced optical wiring apparatus according to a second embodiment. The second embodiment includes a circuit equivalent to the laser-induced optical wiring apparatus of FIG. 1, and a peripheral circuit. However, it should be noted that the method for operating the apparatus is not limited to that described below, like the above-described operation method.

In FIG. 7, the circuit including elements 12a, 13 and 12b and enclosed by the broken line is equivalent to the first embodiment. Bias resistors Rd may be located on or outside the substrate of the apparatus of FIG. 1. In the second embodiment, assume that the bias voltage applied to the bias resistor Rd connected in series to the active layer 12a (elements 12a, 14a and 11 constitute a pn-junction diode) is Vd, the bias current flowing through the bias resistor Rd is Id, the voltage applied at the connection terminal between the bias resistor Rd and active layer 12a is Vsa, and the current flowing from the terminal Vsa is Isa. The oscillation threshold values acquired when the same current is flown through the active layers 12a and 12b are set as Ith and Vth that serve as laser oscillation characteristics. Namely, assume that the current corresponding to the oscillation threshold values is Ith/2 for each active layer 12a, 12b.

As an operation example of the circuit, assume that Id is set to a value slightly lower than the threshold current value, e.g., 0.95×Ith/2 (=0.475 Ith), and that the signal transmission side flows a current Is sufficiently greater than Ith. In this state, when Is=0 (Isa=Isb=0), Vsa and Vsb is substantially equal to Vth. At this time, a current of Isa=2Ith as a signal is supplied to, for example, the active layer 12a, whereby although the active layer 12b is supplied with a current lower than the threshold value, the entire system assumes a laser oscillation enabled state as a result of the application of light from the active layer 12a.

Upon occurrence of laser oscillation, the effective threshold value (the current value reaching the quantity of light corresponding to the oscillation threshold value) of the active layer 12b is reduced. This state is equivalent to the case where a bias current higher than the threshold value is supplied to the active layer 12b. Accordingly, the element voltage is reduced because of the principle previously described referring to FIG. 6. Namely, Vsb is reduced as a result of the supply of Isa, and a variation in Vsb is extracted to realize the transmission of a signal from the active layer 12a to the active layer 12b. In contrast, Vsa can be reduced as a result of the supply of Isb, thereby realizing signal transmission in the opposite direction.

Furthermore, Id may be preset to a value higher than Ith/2, e.g., Ith (the entire current is 2Ith) to make the system perform laser oscillation from the beginning, and Isa and Isb may be set to a negative current level (e.g., −Ith) that can stop laser oscillation. In this case, the phase of a signal output is opposite to that of the signal output acquired when a bias not higher than the threshold value is supplied.

Third Embodiment

Figure 8:
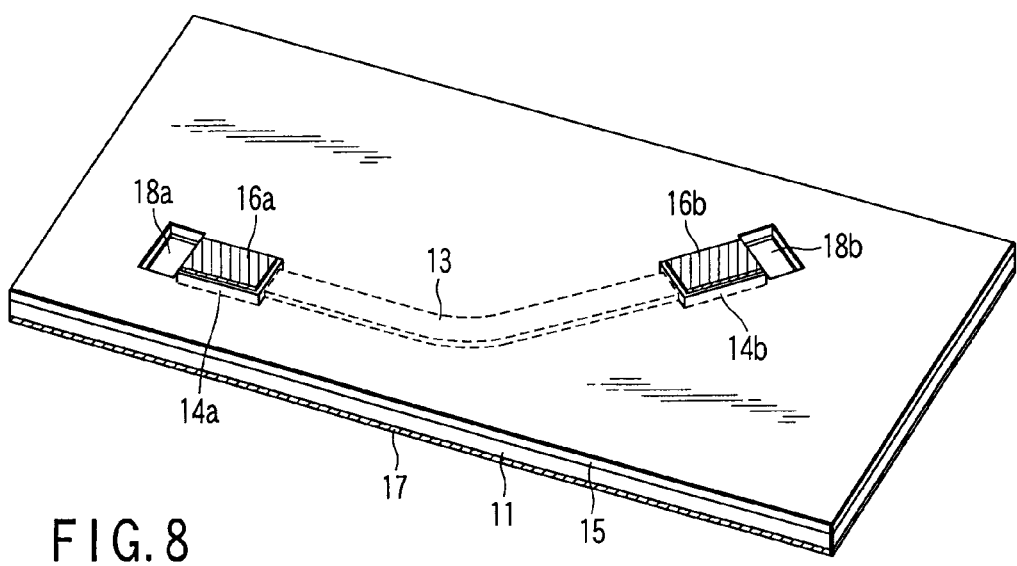
FIG. 8 is a schematic perspective view illustrating the structure of a laser-induced optical wiring apparatus according to a third embodiment.

Although the first and second embodiments employ a linear optical waveguide, the optical waveguide may be angled as shown in FIG. 8. In this case, the optical loss of the optical waveguide 13 is the sum of absorption losses αt and Lt and a loss due to the angled portion, and the influence of the optical loss appears as an increase in the laser oscillation threshold value due to the angled portion.

Figure 9:
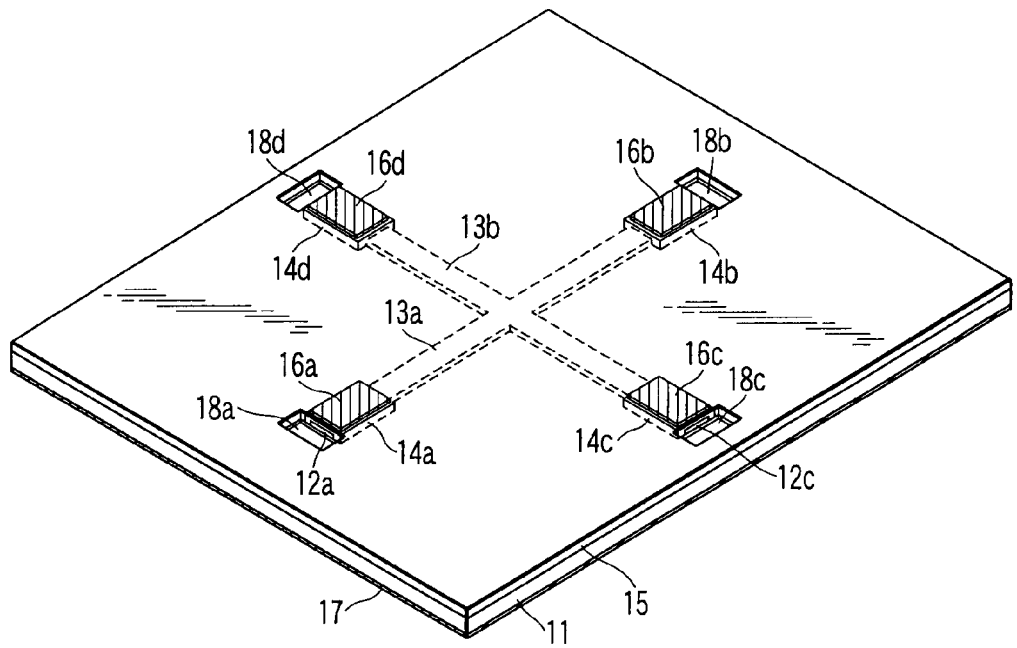
FIG. 9 is another schematic perspective view illustrating the structure of the laser-induced optical wiring apparatus of the third embodiment.

Alternatively, the optical waveguide may comprise two perpendicularly intersecting waveguide components as shown in FIG. 9. Specifically, in FIG. 9, there are provided a first optical waveguide 13a similar to the optical waveguide 13, and a second optical waveguide 13b perpendicular thereto. Third and fourth mirrors 18c and 18d are provided at the opposite ends of the second optical waveguide 13b, and third and fourth active layers 12c and 12d and electrodes 16c and 16d are provided near the mirrors 18c and 18d, respectively.

Even if the two optical waveguides 13a and 13b (extending between the mirrors 18a and 18b and between the mirrors 18c and 18d) perpendicularly intersect each other, the same signal transmission as the above can be realized. This is an application of the fact that perpendicularly intersecting light beams do not interfere with each other. When the two waveguides 13a and 13b perpendicularly intersect each other, they can function as independent optical wiring members. Note that it is necessary to make the waveguides intersect perpendicularly.

As described above, in the laser-induced optical wiring apparatus of the embodiment, the essential function of the optical waveguide 13 does not change because of the configuration, wiring pattern, perpendicular intersecting state, etc.

Fourth Embodiment

Figure 10:
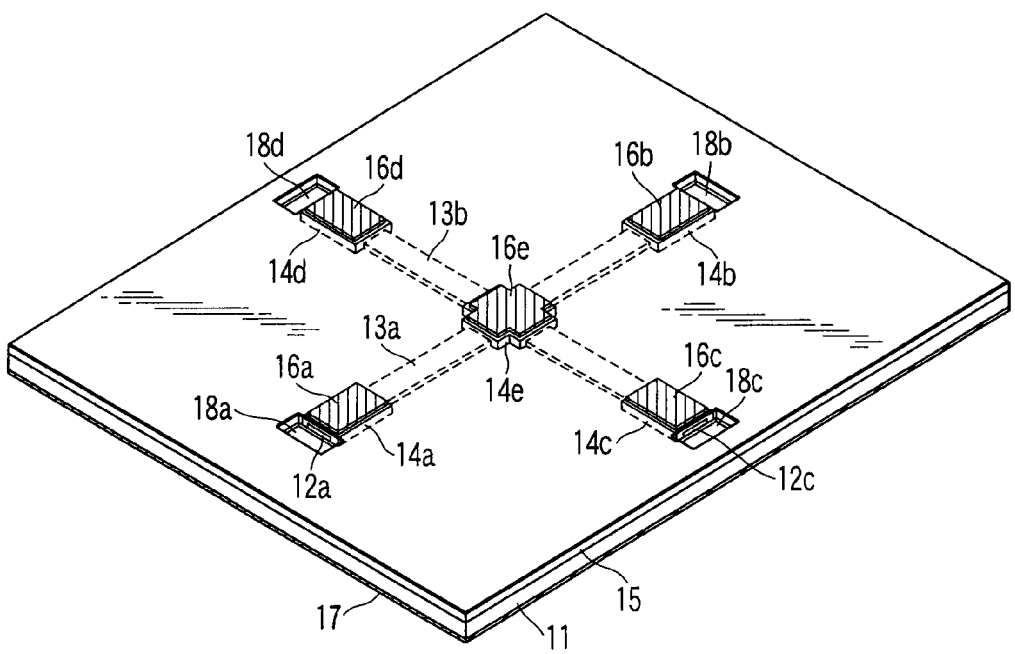
FIG. 10 is a schematic perspective view illustrating the structure of a laser-induced optical wiring apparatus according to a fourth embodiment.

FIG. 10 shows a fourth embodiment of the invention. As shown, the fourth embodiment differs from the third embodiment shown in FIG. 9 in that the former employs an active layer, which is located at the intersection of the perpendicularly intersecting wiring members and has an additional function. Specifically, an electrode 16e is provided on the intersection, and an active layer (not shown) similar to the active layers 12a to 12d is provided below the electrode 16e. Further, two laser-induced optical wiring apparatuses, which utilize a laser oscillator formed of the three electrodes 16a, 16e and 16b, and a laser oscillator formed of the three electrodes 16c, 16e and 16d, are synthesized using the central active layer (located below the electrode 16e).

The operation of a laser oscillator formed of three electrodes (e.g., 16a, 16e and 16b) will be described. This laser oscillator can emit signals from the three electrodes, like the previously described two-electrode laser-induced optical wiring apparatus. Further, a signal input to one of the electrodes can be received by the other two electrodes. This laser oscillator is operated such that the operation circuit shown in FIG. 7 is applied to the three active layers to operate them in the same manner as in FIG. 7.

A description will now be given of the operation of two laser-induced optical wiring apparatuses—one apparatus using a laser oscillator formed of three electrodes 16a, 16e and 16b, and the other using a laser oscillator formed of three electrodes 16c, 16e and 16d. The coupling operation of the two laser-induced optical wiring apparatuses can be realized via the active layer provided below the electrode 16e. For instance, when the electrode 16e is used as a transmission electrode, information from the electrode 16e can be transmitted to all the remaining four electrodes. Further, information (signal) transmitted from the electrodes 16a, 16b, 16c and/or 16d can be received by the electrode 16e. In addition, signal transmission can also be performed between the two laser-induced optical wiring apparatuses.

Thus, the common active layer provided between the optical waveguides as shown in FIG. 10 enables transmission between them or optical wiring between a large number of points.

Fifth Embodiment

Figure 11:
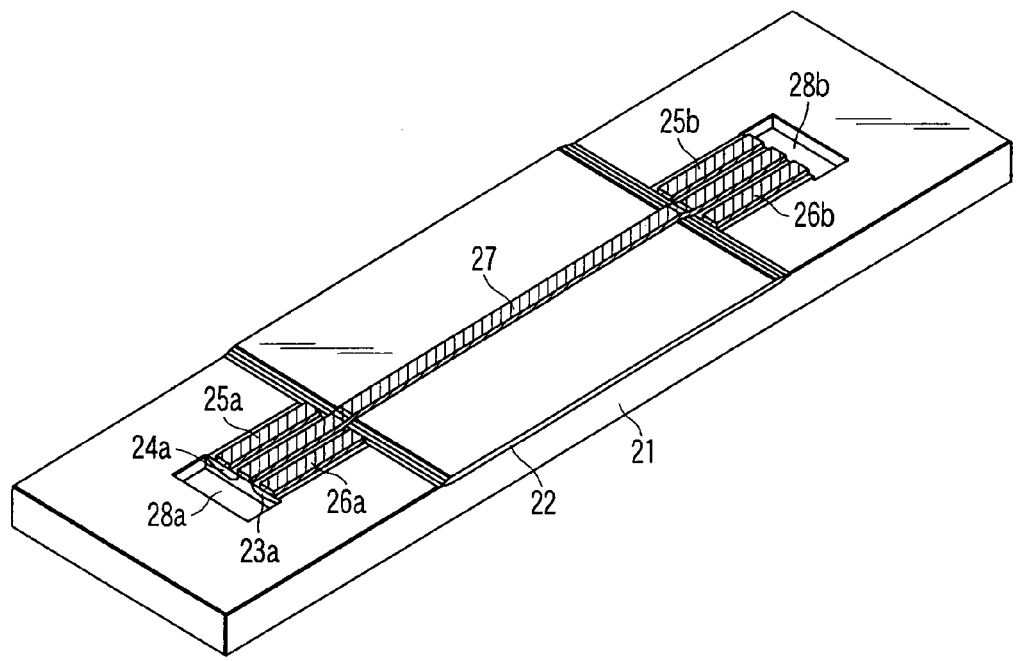
FIG. 11 is a schematic perspective view illustrating the structure of a laser-induced optical wiring apparatus according to a fifth embodiment.

FIG. 11 shows a fifth embodiment of the invention in which a surface plasmon waveguide is employed as the optical waveguide. In this embodiment, the laser active layer is formed of part of an Si substrate, and the optical waveguide is formed of a metal thin film. Specifically, in FIG. 11, reference number 21 denotes an Si substrate, reference number 22 denotes an $SiO_2$ cover, reference numbers 23a and 23b denote p-wells, reference numbers 24a and 24b denote n-wells, reference numbers 25a and 25b denote n-electrodes, reference numbers 26a and 26b denote p-electrodes, reference number 27 denotes a surface plasmon guide (metal thin film), and reference numbers 28a and 28b denote reflection mirrors.

Assume here that the electrodes 25a, 25b, 26a and 26b are formed of Al, and the surface plasmon guide 27 is formed of Au and has a thickness of 40 nm, a width of 2 μm and a length of 100 μm. Below the Au thin film as the plasmon guide 27, an insulation film formed of $SiO_2$ and having a thickness of 20 nm is provided. Si emission sections (laser active sections) are formed of parts of the substrate 21 located between the p-well 23a and n-well 24a and between the p-well 23b and n-well 24b, and perform optical re-coupling when carriers are injected from both the n- and p-wells.

When the p-wells or n-wells are formed, a dopant paste, mixed with $SiO_2$ particles with a particle diameter of about 10 nm, is coated by spin coating and thermally diffused. As a result, an uneven diffusion front of several nm to several tens nm is formed, thereby accelerating optical re-coupling utilizing the carrier confining effect by the nano-size unevenness. Further, a rare-earth dopant may be injected into the Si emission section to make it perform rare-earth emission, or nano-size Si particles coated with an $SiO_2$ film of several nm may be provided to perform fine-particle Si emission.

Figure 12:
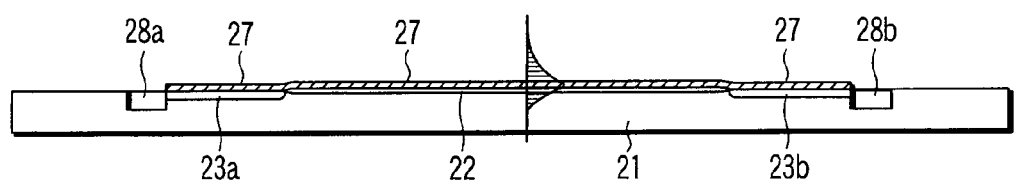
FIG. 12 is a sectional view illustrating the structure of the laser-induced optical wiring apparatus according to the fifth embodiment.

The surface plasmon is a kind of polariton acquired by coupling light to various types of polarized waves. Namely, it is a light propagation mode on a metal surface, in which light is coupled to free-electron shift polarization. In general, it is called surface plasmon polariton (SSP). As shown in FIG. 12, SSP light is confined in a zone having the metal boundary as its center, and if the Si emission section is positioned within the range of the photoelectric field distribution of SSP, it can perform stimulated emission.

In the embodiment of FIG. 11, respective diodes are formed between the electrodes 25a and 26a and between the electrodes 25b and 26b, and when a forward current is flown through the diodes, the diodes emit light. Further, when a current is flown between the electrodes 25a and 26a and between the electrodes 25b and 26b, the opposite active layers emit light, and laser oscillation using the mirrors 28a and 28b is performed. In this state, signal transmission is performed in the same way as in the above-described embodiments.

Figure 13:
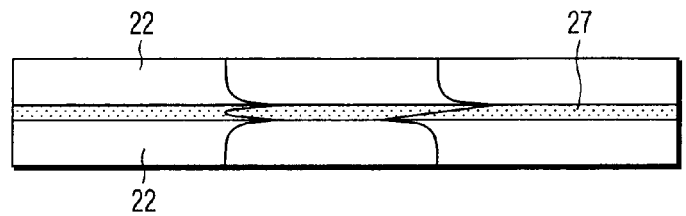
FIG. 13 is a sectional view illustrating the structure of an optical guide portion employed in the fifth embodiment, and a waveguide mode occurring in the guide portion.
Figure 14:
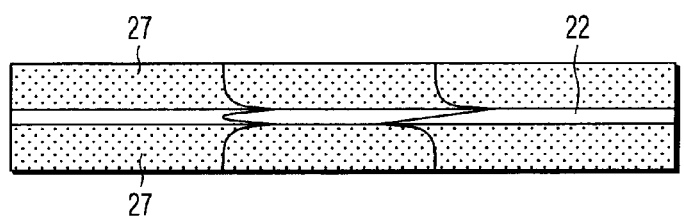
FIG. 14 is a sectional view illustrating the structure of another optical guide portion employed in the fifth embodiment, and a waveguide mode occurring in the guide portion.

In general, a waveguide mode exists at the boundary of a metal and dielectric. Further, in the case of a metal thin film, a waveguide mode, in which SPPs at the obverse and reverse sides of a metal are coupled, exists as shown in FIG. 13. The curves in FIG. 13 indicate wave surfaces of the SPP waveguide mode. There is a case where the obverse-side SPP and reverse-side SPP have the same phase, and a case where they have different phases. Further, as shown in FIG. 14, the waveguide mode in which two SPPs are coupled exists even in a fine gap between thin metal layers. These waveguide structures may be used in accordance with the place, peripheral conditions, etc.

(Modification)

The invention is not limited to the above-described embodiments. Although various structural components are employed in the embodiments, they are merely examples, and another means (material, size, etc.) may be used in place of each component, without departing from the scope of the invention. Further, the materials, configurations, arrangement, etc., are merely examples. Some of the embodiments may be combined appropriately.

Figure 15:
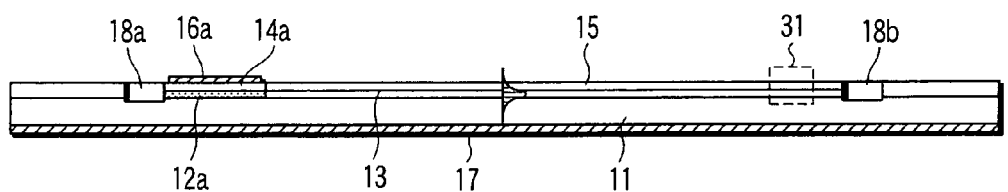
FIG. 15 is a sectional view illustrating the structure of a modification of the invention.

Specifically, although in the embodiments, optical gain sections are provided at the opposite ends of the optical waveguide, one of them may be replaced with an optical switch 31 as shown in FIG. 15. Also in this case, by varying the optical loss of the optical waveguide 13 using the optical switch 31, the laser oscillation state can be varied, thereby providing the same advantage as the above-described embodiments. In this case, however, a signal voltage is applied in only one direction (i.e., from the optical switch 31 to the optical gain section 21), which differs from the above embodiments in which the voltage can be applied in opposite directions.

Figure 16:
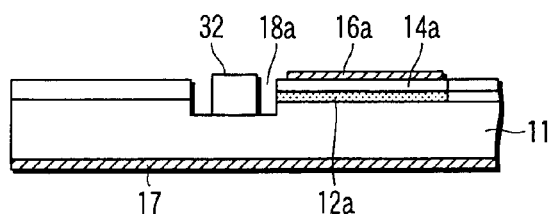
FIG. 16 is a sectional view illustrating the structure of another modification of the invention.

In addition, although in the embodiments, the optical gain section detects a change in laser oscillation state, a photodetector may be provided for detecting the light guided through the optical waveguide to thereby detect a change in laser oscillation state. For example, a photodetector 32 may be provided outside the mirror 18a to detect the light passing therethrough, as shown in FIG. 16. The location of the photodetector 32 is not limited to this. It is sufficient if the photodetector can detect the light guided through the optical waveguide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser-induced optical wiring apparatus comprising:
   a substrate;
   a first light-reflecting member and a second light-reflecting member, which are provided on the substrate separately from each other;
   an optical waveguide provided on the substrate, the optical waveguide optically coupling the first light-reflecting member and the second light-reflecting member to form an optical resonator;
   a first optical gain member provided across a portion of the optical waveguide; and
   a second optical gain member provided across a portion of the optical waveguide separately from the first optical gain member, wherein the first optical gain member and the second optical gain member forms a laser oscillator along with the first light-reflecting member and the second light-reflecting member, wherein:
   when the first and second optical gain members are activated, the laser oscillator performs laser oscillation;
   when a gain of one of the first optical gain member and the second optical gain member is changed by an input signal, a total gain of an optical path extending between the first light-reflecting member and the second light-reflecting member is changed to change a laser oscillation state of the laser oscillator formed by the first optical gain member and the second optical gain member; and a change in the laser oscillation state is detected by the other of the first optical gain member and the second optical gain member.

2. The apparatus according to claim 1, wherein the first optical gain member and the second optical gain member are activated when a current is flown through each of the first optical gain member and the second optical gain member, and a change in the laser oscillation state of the laser oscillator is detected when a voltage at a corresponding one of the first optical gain member and the second optical gain member or a current flowing through the one of the first optical gain member and the second optical gain member is changed.

3. The apparatus according to claim 1, wherein at least a portion of the optical waveguide extending between the first light-reflecting member and the second light-reflecting member is angled.

4. The apparatus according to claim 1, wherein the optical waveguide is a surface plasmon waveguide.

5. The apparatus according to claim 1, wherein:

in a transmitting mode, each of the first optical gain member and the second optical gain member changes its gain in accordance with an input signal to change a laser oscillation state of the laser oscillator; and in a receiving mode, each of the first optical gain member and the second optical gain member keeps a state of its activation constant to detect, as a received signal, a change in activated carrier consumption corresponding to a change in its laser oscillation state, wherein said each of the first optical gain member and the second optical gain member serves as both a transmission member and a reception member to enable bidirectional transmission or multipoint transmission.

* * * * *